United States Patent
Cai et al.

(10) Patent No.: US 7,045,830 B1
(45) Date of Patent: May 16, 2006

(54) HIGH-VOLTAGE DIODES FORMED IN ADVANCED POWER INTEGRATED CIRCUIT DEVICES

(75) Inventors: Jun Cai, Scarborough, ME (US); Micheal Harley-Stead, Portland, ME (US); Jim G. Holt, Los Altos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/005,755

(22) Filed: Dec. 7, 2004

(51) Int. Cl.
*H01L 29/43* (2006.01)

(52) U.S. Cl. .................. 257/139; 257/141; 257/144; 257/557

(58) Field of Classification Search ............... 257/139, 257/141, 143, 144, 147, 152, 557, 605, 653
See application file for complete search history.

(56) References Cited

U.S. PATENT DOCUMENTS

| | | | |
|---|---|---|---|
| 4,117,507 A | 9/1978 | Pacor | |
| 5,343,052 A | 8/1994 | Oohata et al. | |
| 5,512,495 A | 4/1996 | Mei et al. | |
| 5,869,850 A | 2/1999 | Endo et al. | |
| 6,429,501 B1* | 8/2002 | Tsuchitani et al. | 257/493 |
| 6,927,102 B1* | 8/2005 | Udrea et al. | 438/140 |

* cited by examiner

*Primary Examiner*—Sara Crane
(74) *Attorney, Agent, or Firm*—Thomas R. FitzGerald, Esq.; Hiscock & Barclay, LLP (57) ABSTRACT

A diode-connected lateral transistor on a substrate of a first conductivity type includes a vertical parasitic transistor through which a parasitic substrate leakage current flows. Means for shunting at least a portion of the flow of parasitic substrate leakage current away from the vertical parasitic transistor is provided.

26 Claims, 6 Drawing Sheets

HIGH-VOLTAGE DIODES FORMED IN ADVANCED POWER INTEGRATED CIRCUIT DEVICES

FIELD OF THE INVENTION

The present invention relates to power integrated circuit devices and, more particularly, to high voltage diodes formed in power integrated circuits.

DESCRIPTION OF THE RELATED ART

It is often desirable, if not necessary, to form high-voltage diodes integrally with, i.e., on the same substrate as, power integrated circuits (PICs). For this purpose, a Lateral PNP transistor is often formed integrally with a PIC and interconnected to function as a high-voltage diode.

Figure 1:
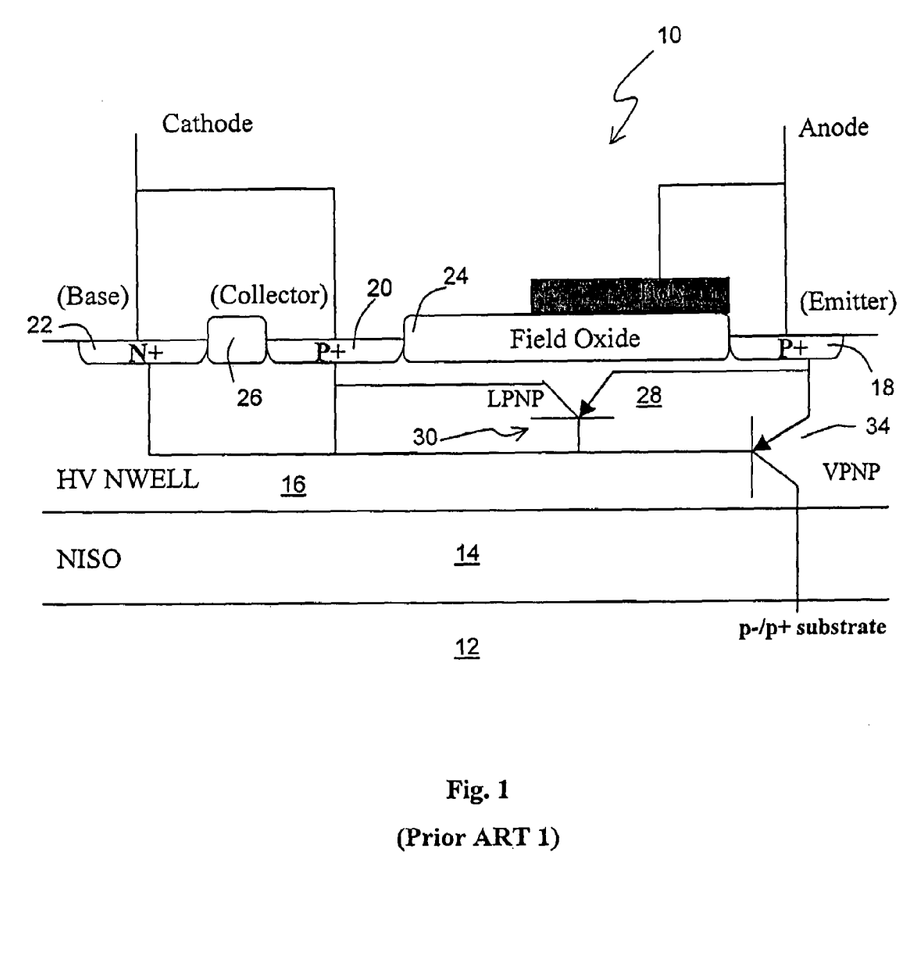
FIG. 1 is a cross-sectional view of one embodiment of a conventional diode-connected lateral transistor.

Such a diode-connected lateral PNP transistor is shown in FIG. 1. Diode-connected transistor 10 generally includes a substrate 12 of a first conductivity type, such as, for example, p-type. An isolation region 14 of a second conductivity type, such as, for example, n-type, is formed in a portion of an epitaxial layer that is grown on substrate 12. A high voltage (HV) well 16 (or epitaxial layer) of the second conductivity type is formed above the isolation region 14, and an emitter well 18 of the first conductivity type is formed in the HV well 16. A collector well 20 of the first conductivity type is formed in the HV well 16, and a base well 22 of the second conductivity type is formed in HV well 16 and spaced apart from collector well 20. Field oxide isolation layers 24 and 26 are formed on the surface of HV well 16, with field oxide 24 disposed between emitter well 18 and collector well 20 and field oxide 26 disposed between collector well 20 and base well 22. Drift region 28, to support high reverse-bias voltage, includes the portion of HV well 16 between emitter well 18 and collector well 20, i.e., the portion of HV well 16 underlying field oxide 24. A lateral transistor 30 is formed between emitter well 18, collector well 20 and base well 22. Collector well 20 and base well 22 are interconnected to form the cathode, and the emitter well 18 forms the anode, of the diode-connected transistor 10.

Generally, a high-voltage diode desirably has a low on-state resistance (low forward voltage drop), fast switching speed, low parasitic substrate current and a high reverse breakdown voltage. However, diode-connected transistors are somewhat limited in respect to the aforementioned desired characteristics. More particularly, the reverse breakdown voltage of such a diode is determined in large part by the length of drift region 28, i.e., longer drift regions provide higher reverse breakdown voltages. For example, in a 0.35 micron technology device, a drift region of approximately 6 microns in length provides a reverse breakdown voltage of only 32 Volts due to shallow junctions in the advanced technology device. Thus it is seen that producing devices with high reverse breakdown voltages, and therefore relatively long drift regions, deeper junctions and increased mask count, undesirably consumes large amounts of real estate on the integrated circuit substrate, increases costs and increases the forward bias voltage drop due to the high on-state resistance of the diode on the integrated circuit substrate. Measures to more evenly distribute the electrical field, such as, for example, polysilicon field plates, provide only moderate improvement in reverse breakdown voltage for a given drift length with shallow junctions.

Such diode-connected transistors also generally have an undesirably low current gain (beta) between the emitter/anode and collector/cathode. The low current gain is primarily due to the relatively long drift region that separates the emitter and collector regions. When the diode-connected transistor is forward-biased, a vertical parasitic transistor existing between the emitter/anode region, drift region, and substrate is also forward biased. This vertical parasitic transistor is represented in FIG. 1 by transistor 34, which has HV NWELL 16 and NISO 14 as a base, emitter well 18 as an emitter, and substrate 12 as a collector. The vertical parasitic transistor 34 conducts a parasitic substrate leakage current from the emitter well 18 (emitter/anode) to substrate 12 (collector). Due to the low current gain of the diode-connected transistor 12 (or the lateral transistor), the substrate leakage current conducted by the vertical parasitic transistor 34 is typically of an appreciable magnitude relative to the current carried by diode-connected lateral transistor 12. Under some circumstances, the substrate leakage current may dominate the operation of the diode, such as, for example, in a device having a large drift length and a low dopant concentration in the isolation region.

Figure 2:
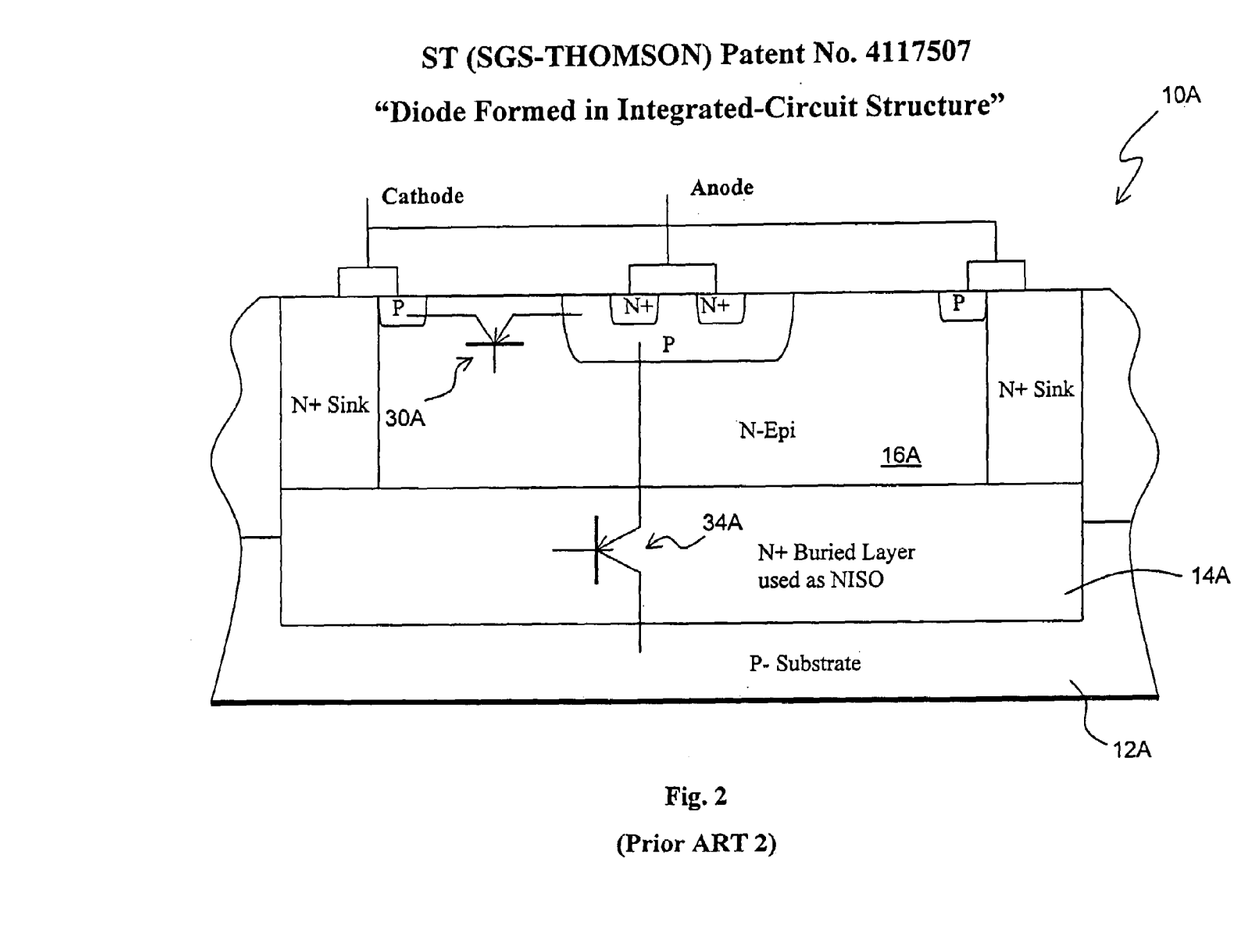
FIG. 2 is a cross-sectional view of another embodiment of a conventional diode connected lateral transistor.

FIG. 2 illustrates another embodiment of a diode-connected lateral transistor 10A in which a heavily-doped buried layer 14A of the second conductivity type, used as an isolation layer, with an overlying deep HV well or epitaxial layer 16A of the second conductivity type are used to reduce the leakage current carried by the vertical parasitic transistor 34A. However, the heavily-doped buried layer 14A and deep HV well or epitaxial layer 16A decrease the current gain of the diode-connected lateral transistor and reduce the reverse breakdown voltage of the diode, especially in deep submicron PIC technology. Therefore, in devices having a heavily-doped buried layer with an overlying epitaxial layer or HV well, a drift region of increased length is required to provide a given reverse breakdown voltage. As integrated circuit designers and manufacturers strive to reduce overall device size and thereby increase circuit density on integrated circuit substrates, increasing the drift length and/or depth of the HV well or epitaxial layer, which is also normally used as the drift region for drivers, such as LDMOS, is an undesirable approach to increasing reverse breakdown voltage.

Therefore, what is needed in the art is a diode formed integrally on the same substrate with an advanced PIC and which achieves a given level of protection against reverse breakdown and yet has a relatively small/short drift region and, thus, a reduced device size.

Furthermore, what is needed in the art is a diode formed integrally with and on the same substrate as an advanced PIC and which achieves a given level of protection against reverse breakdown and yet has a relatively small/short drift region and, thus, a reduced forward voltage drop.

Moreover, what is needed in the art is a method of fabricating a diode integrally with and on the same substrate as an advanced PIC and which achieves a given level of protection against reverse breakdown with a relatively small/short drift region and a reduced parasitic substrate leakage current.

SUMMARY OF THE INVENTION

The present invention provides a high-voltage diode-connected transistor with improved reverse breakdown voltage, reduced parasitic leakage current, and reduced size.

The invention comprises, in one form thereof, a diode-connected lateral transistor on a substrate of a first conductivity type includes a vertical parasitic transistor through which a parasitic substrate leakage current flows. Means for shunting at least a portion of the flow of parasitic substrate leakage current away from the vertical parasitic transistor is provided.

An advantage of the present invention is that the parasitic substrate leakage current is reduced.

Another advantage of the present invention is that reverse breakdown voltage is increased.

A still further advantage of the present invention is that the size of the device is reduced.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 3:
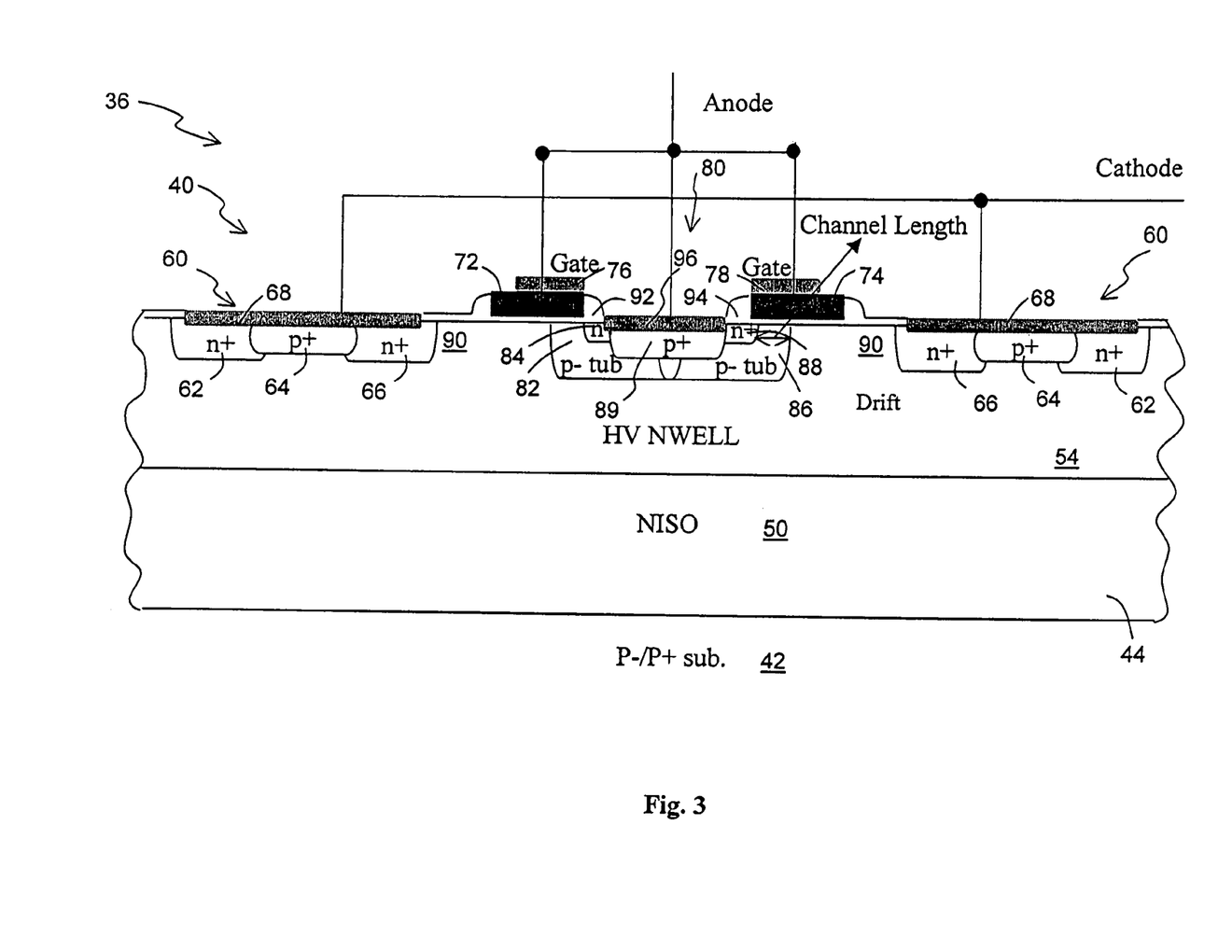
FIG. 3 is a cross-sectional view of one embodiment of a diode formed in PIC of the present invention.

Referring now to the drawings and particularly to FIG. 3, there is shown one embodiment of a high-voltage diode formed in PIC of the present invention. PIC 36 is a conventional power integrated circuit and high-voltage diode 40 is formed integrally with PIC 36 on a semiconductor monocrystalline substrate 42 of a first conductivity type, such as, for example, a p– type silicon substrate or p– epitaxial layer formed over a p+ type silicon substrate. A diffusion layer 44 of a second polarity type, such as, for example, n type, is diffused into substrate 42 and thereby forms an n-type isolation (NISO) or buried layer 50. Buried layer 50 is configured as either a buried n+ layer and/or a buried n-well that is compatible with the layers and architecture used in fabricating driver devices, such as LDMOS drivers, formed in the same PIC built on substrate 42. After formation of buried layer 50, an epitaxial layer (not referenced) of the first polarity type and of a very low dopant concentration, typically approximately $5E14$ atoms/cm$^3$, is formed, such as, for example, by deposition, over at least the NISO buried layer 50. Within this epitaxial layer and above NISO 50 a high-voltage (HV) well 54 is formed by diffusion and is connected with isolation layer 50. HV well 54 has a low dopant concentration, typically around $1E16$ atoms/cm$^3$.

Cathode and anode structures are formed within HV well 54 using conventional masking and implanting steps. More particularly, cathode structures 60 formed in HV well 54 each include a respective outer n+ well 62, p+ well 64 and inner n+ well 66. Each n+ well 62 and 66 is doped with an n-type dopant, such as, for example, arsenic and/or phosphorous, to a dopant concentration of from approximately $5E18$ to approximately $1E21$ atoms/cm$^3$ and to a depth of from approximately 0.15 to approximately 0.8 micrometers. Each p+ well 64 is doped with a p-type dopant, such as, for example, boron, to a dopant concentration of from approximately $1E19$ to approximately $1E21$ atoms/cm$^3$ and to a depth of from approximately 0.12 to approximately 0.5 micrometers.

A layer of silicide 68 is formed in known manner upon and electrically interconnects (i.e., shorts together) corresponding outer n+ wells 62, p+ wells 64 and inner n+ wells 66 to thereby form cathodes 60. Cathodes 60 are electrically interconnected (i.e., shorted) together, such as, for example, by electrical conductors formed over and insulated from the surface of HV well 54.

A pair of gates 72 and 74 are formed over HV well 54 and inside (i.e., between) a corresponding pair of cathode structures 60. The gate electrodes (not referenced) are formed of a conductive material, such as heavily-doped polysilicon, and are disposed upon a layer of insulating material, typically silicon dioxide. An outer edge of each gate 72 and 74 is disposed a predetermined distance, such as, for example, 0.15 to 5 microns, from the inner edge of a corresponding one of cathode structures 60. Respective layers of silicide 76 and 78 are formed over at least a portion of the top surface of the electrodes of gates 72 and 74.

Anode structure 80 is formed in HV well 54 between gates 72 and 74, and includes two pairs of hetero-doped wells 82, 84 and 86, 88 and one p+ well 89. Hetero-doped wells 82, 84 and 86, 88 are formed in self alignment with the facing or inner edges of gates 72 and 74, respectively. Prior to the formation of gate oxide sidewall spacers, to be described hereinafter, hetero-doped wells 82, 84 and 86, 88 are implanted with hetero-dopants using one mask layer. Hetero-doped wells 82 and 86 are relatively deep p-type tubs or wells, whereas wells 84 and 88 are relatively shallow n+ tubs or wells.

More particularly, p– tubs 82 and 86 are formed by implanting p-type dopant ions, such as, for example, boron ions, into the portion of HV well 54 that lies between gates 72 and 74. P– tubs 82 and 86 have a dopant concentration of approximately $5E16$ to approximately $5E18$ atoms/cm$^3$ and a depth of from approximately 0.2 to approximately 0.9 micrometers. P– tubs 82 and 86 are formed in self-alignment with the inner or facing edges of the electrodes of gates 72 and 74, respectively, and are implanted at an angle to a predetermined distance underneath a corresponding one of gates 72 and 74. Preferably, after some thermal budgets, such as, for example, gate seal oxidation and/or high temperature anneals, p-tubs 82 and 86 diffuse from approximately 0.18 to approximately 0.75 micrometers underneath the inner edges of the electrodes of gates 72 and 74.

After sidewall spacers 92 and 94, typically of oxide, are deposited and etched, p+ well 89 is formed approximately in the center of anode area 80 and a predetermined distance from the inner edges of the electrodes of gates 72 and 74. P+ well 89, as shown, overlaps n+ wells 84 and 88. More particularly, sidewall spacers 92 and 94 on the sides of the electrodes of gates 72 and 74 mask off and protect only the portion of the shallow n+ well regions 84 and 88 that are adjacent the gate electrodes and channels. Thus, p+ well region 89 overlaps a substantial portion of n+ well regions 84 and 88 and is disposed in close proximity to the channels. The resistance of the p– tubs 82 and 86 underneath the effective n+ well areas (i.e., the portion of n+ wells 84 and 88 under sidewall spacers 92 and 94) is very small due to the deep and narrow p-tubs 82 and 86. Therefore, high-voltage diode 40 has a very low cathode to anode leakage even at high levels of reverse bias.

P+ well 89 is doped with p-type dopant ions, such as, for example, boron and/or BF2, to a dopant concentration of approximately 1E19 to 1E21 atoms/cm$^3$ and a depth of from approximately 0.12 to approximately 0.5 micrometers. N+ wells 84 and 88 each have an n-type dopant concentration of from approximately 5E18 to approximately 1E21 atoms/cm$^3$ and a depth of from approximately 0.03 to approximately 0.25 micrometers. A layer of silicide 96 is formed between the sidewall spacers 92 and 94 and over any exposed portions of n+ wells 84 and 88 and p+ well 89. Silicide layer 96 electrically interconnects p– tubs 82 and 86, n+ wells 84 and 88, and p+ well 89.

Gates 72 and 74 are electrically interconnected with each other and also electrically interconnected with silicide layer 96, such as, for example, by electrical conductors formed over and insulated from the surface of HV NWELL 54, and thus are electrically interconnected to p– tub wells 82 and 86, n+ wells 84 and 88, and p+ well 89, to thereby form anode 80. Drift region 90 extends laterally from the inner portion of cathode 60 to the outer portion of p– tub wells 82 and 86. Diode 40 achieves a reverse breakdown voltage of approximately 33 volts with a drift region 90 of only approximately 1.3 micrometers in length.

Figure 4:
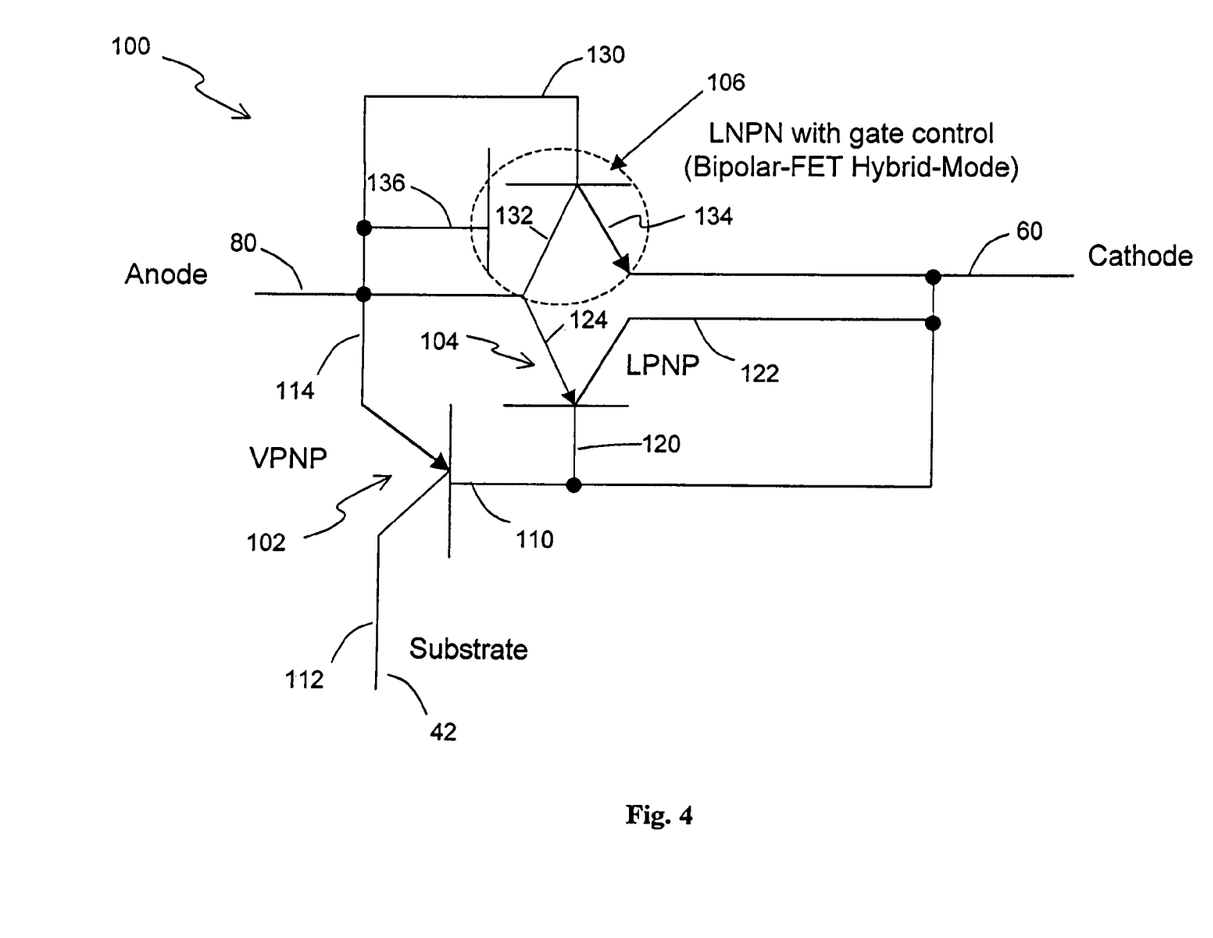
FIG. 4 is an equivalent circuit for the diode of FIG. 2.

Referring now to FIG. 4, an equivalent circuit for diode 40 is illustrated. Equivalent circuit 100 includes a vertical parasitic transistor 102, a lateral transistor 104 and a gate-controlled lateral transistor 106. More particularly, cathode 60 of diode 40 forms the base 110, substrate 42 forms the collector 112, and anode p+ well 89 and p-tub wells 82 and 86 form the emitter 114 of vertical parasitic transistor 102. Cathode 60 of diode 40 also forms the base 120 and collector 122 of lateral transistor 104. Anode 80 along with p+ well 89 and p-tub wells 82 and 86 form emitter 124 of lateral transistor 104. Anode 80 of diode 40 further forms base 130 (p+ well 89 and p– tub wells 82 and 86) and collector 132 (n+ wells 84 and 88) of gate-controlled lateral transistor 106. Cathode 60 forms emitter 134 (drift region 90) of gate-controlled lateral transistor 106. Anode 80 also forms gate 136 (gates 72 and 74) of gate-controlled lateral transistor 106.

In use, and as is described more particularly hereinafter, high-voltage diode 40 operates in a bipolar-FET hybrid mode of operation. In other words, high-voltage diode 40 operates simultaneously in the bipolar and the FET modes of operation, i.e., a bipolar-FET hybrid mode.

More particularly, anode current commences to flow with a positive bias voltage applied to anode 80 (FIG. 4) relative to cathode 60 and a voltage applied to gate 136 that is at least equivalent to the voltage drop of a forward-biased p-n junction, such as, for example, approximately 0.7 Volts. Thus, gate-controlled lateral transistor 106 operates in the bipolar mode and has a high current gain due to the short channel length thereof.

Gate-controlled lateral transistor 106 also operates in the FET mode of operation. The p– tub wells 82, 86 are tied to control gates 72 and 74, and as the voltage applied to anode 80 increases the junctions between p-tub wells 82, 86 and HV NWELL 54 become forward biased thereby reducing the gate threshold voltage drop. With thin gate oxide and low threshold voltage, such as, for example, 0.7 V or less, the surface channel is turned on, and in this way gate-controlled lateral transistor 106 also operates in the FET mode.

The short channel length and high current gain in gate-controlled lateral transistor 106 draws or provides a low-resistance path for current from anode to cathode that would otherwise flow through parasitic vertical PNP transistor 102, and thereby reduces the parasitic substrate leakage current.

Lateral PNP transistor 104 also acts to reduce the parasitic substrate leakage current. After the junction between p– tubs 82, 86 and HV NWELL 54 becomes forward biased, holes are injected into HV NWELL 54. Most of the holes injected into HV NWELL 54 recombine with electrons flowing in the surface channel. Some of the injected holes, however, are collected by the p+ cathode 64 without flowing through and/or under NISO buried layer 50, and are thereby prevented from adding to or increasing the parasitic substrate leakage current.

The parasitic leakage current is also further reduced by heavily doping the NISO buried layer 50 to thereby reduce the current gain of vertical PNP transistor 102. However, as discussed above, NISO buried layer 50 must be compatible with the layers and architecture used in fabricating driver devices, such as LDMOS drivers, formed in the same PIC built on substrate 42, and thus the level to which NISO buried layer 50 is therefore constrained.

The bipolar-FET hybrid mode of operation of diode 40 provides enhanced current drive capability due to the combination of short channel length and high current gain in gate-controlled lateral PNP transistor 106. Lateral PNP transistor 104 also provides increased current drive capability due to the small drift length relative to conventional diode-connected lateral PNP transistors.

When the p– tub 82, 86 to HV NWELL 54 junctions become forward biased and/or enter conduction, the injection of holes into HV NWELL 54 modulates the conductivity of the high-resistivity HV NWELL 54 and reduces the resistance of the region. Thus, diode 40 has a reduced parasitic substrate leakage and low forward voltage drop in the forward-biased active mode of operation.

Under reverse bias conditions, diode 40 has an increased reverse breakdown voltage relative to a conventional diode-connected lateral PNP transistor. For example, a conventional diode-connected lateral PNP transistor with a drift region of approximately 1.3 microns in length typically supports approximately 33 Volts in reverse voltage with a forward voltage drop of approximately 0.8V at a current density of 100 microamperes per square micron ($\mu A/\mu m^2$) of anode area. In the high-voltage diode of the present invention, however, the surface field is reduced by two-dimensional depletion in the reversed-biased diode drift area. The reduced surface field (RESURF) effect has an optimum at a HV NWELL dopant concentration or dose Q/q of approximately 1E12 atoms/cm$^2$, which is compatible with drivers, such as LDMOS drivers, to be formed on the same substrate. The increased capability to withstand reverse voltage is further improved by a gradual dopant profile in n+ cathode wells 62 and 66. Low reverse biased cathode-to-anode leakage current is obtained by hetero-doped wells 84, 82 and 88, 86, as discussed above.

Figure 5:
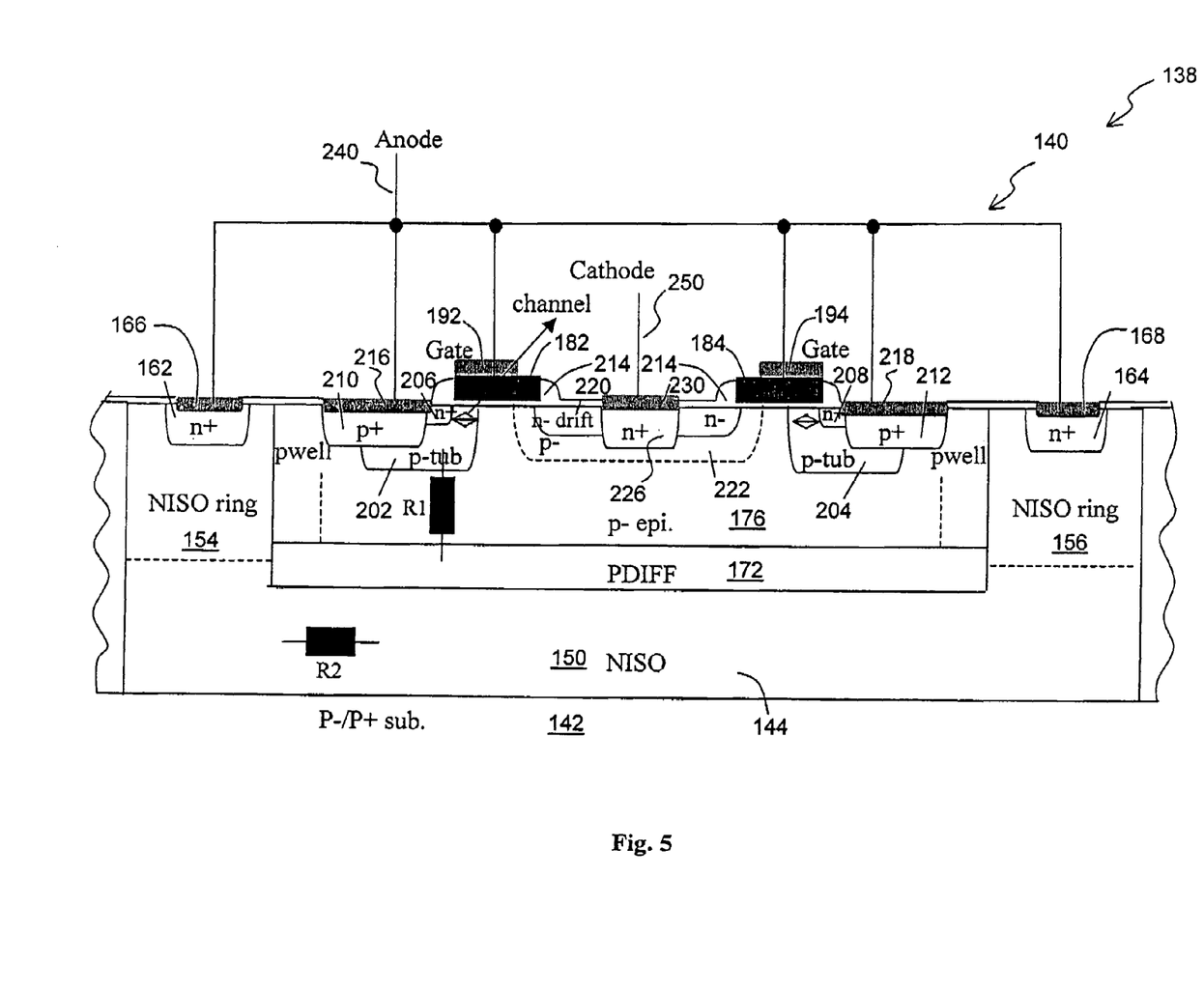
FIG. 5 is a cross-sectional view of a second embodiment of a diode formed in PIC of the present invention.

Referring now to FIG. 5, there is shown a second embodiment of a high-voltage diode formed in PIC of the present invention. PIC 138 is a conventional power integrated circuit and diode 140 is formed integrally with PIC 138 on a semiconductor monocrystalline substrate 142 of a first conductivity type, such as, for example, a p-type silicon substrate or p-epitaxial layer with p+ type silicon substrate.

A first diffusion layer 144 of a second polarity, such as, for example, n type, is formed, such as, for example, diffused into, a surface of substrate 142 and thereby forms an n-type isolation (NISO) or buried layer 150. Buried layer 150 is configured as either a buried n+ layer and/or a buried n-well that is compatible with the layers and architecture used in fabricating driver devices, such as LDMOS drivers, formed in the same PIC 138 built on substrate 142. Spaced apart isolation rings NISO rings 154 and 156 are formed, or defined by subsequently-described structures, in buried layer 150 and extend there from to the exposed surface of the device.

A second diffusion layer PDIFF 172 of the first polarity type is formed in and/or over a portion of isolation layer 150. An epitaxial layer (not referenced) of the first polarity type and of a very low dopant concentration, typically approximately $5E14$ atoms/cm$^3$, is formed, such as, for example, by deposition, over at least PDIFF layer 172. Within this epitaxial layer and above PDIFF layer 172 spaced-apart deep n-type isolation rings (NISO rings) 154 and 156, such as, for example, n+ sink layers and/or high voltage n-type wells, are formed and connected with isolation layer 150. N+ wells 162 and 164 are formed in NISO rings 154 and 156, respectively. N+ wells 162 and 164 each have a dopant concentration of approximately $1E19$ to $1E21$ atoms/cm$^3$ and a depth of from approximately 0.1 to approximately 0.3 micrometers. Layers of silicide 166 and 168 are formed over at least a portion of n+ wells 162 and 164, respectively.

P-diff layer 172 is formed over isolation layer 144 and is disposed between NISO rings 154 and 156. P-diff layer 172 is compatible with the layers and architecture used in fabricating driver devices, such as isolated LDMOS drivers, formed in PIC 138 built on substrate 142. A second epitaxial layer 176 of the first polarity type is formed, such as, for example, grown or deposited, over p-diff layer 172.

Gates 182 and 184 are formed over second epitaxial layer 176 between NISO rings 154 and 156. The gate electrodes (not referenced) are formed of a conductive material, such as heavily-doped polysilicon, and are disposed upon a layer of insulating material, typically silicon dioxide. Respective layers of silicide 192 and 194 are formed over at least a portion of the top surface of the electrodes of gates 182 and 184.

Hetero-doped wells 202, 206 and 204, 208 are formed in self-alignment with the outer edges of the electrodes of gates 182, 184, respectively. Prior to the formation of gate oxide sidewall spacers, to be described hereinafter, hetero-doped wells 202, 206 and 204, 208 are implanted with hetero-dopants using one mask layer. Hetero-doped wells 202 and 204 are relatively deep p-tub wells, whereas wells 206 and 208 are relatively shallow n+ wells. Preferably, after some thermal budgets, such as, for example, gate seal oxidation and/or high temperature anneals, p– tub wells 202 and 204 diffuse from approximately 0.18 to approximately 0.75 micrometers underneath the outer edges of the electrodes of gates 182 and 184, respectively.

P– tub wells 202 and 204 each have a dopant concentration of approximately $5E16$ to $1E18$ atoms/cm$^3$ and a depth of from approximately 0.2 to approximately 0.9 micrometers. N+ wells 206 and 208 are formed within p-tub wells 202 and 204 and in self-alignment with the outer edge of gates 182 and 184, respectively. Each n+ well 206 and 208 are doped with an n-type dopant, such as, for example, arsenic, to a dopant concentration of approximately $1E19$ to $1E21$ atoms/cm$^3$ and have a depth of from approximately 0.03 to approximately 0.12 micrometers.

After gate spacer oxide deposition and etching is completed to thereby form sidewall spacers 214, p+ wells 210 and 212 are formed a predetermined distance from the outer edges of the electrodes of gates 182 and 184, respectively. P+ wells 210 and 212 have a dopant concentration of approximately $1E19$ to $1E21$ atoms/cm$^3$ and a depth of from approximately 0.12 to approximately 0.5 micrometers. Each of the p+ wells 210 and 212 overlap a substantial portion of a corresponding n+ well region 206 and 208, and are thereby disposed in close proximity to the outer edges of the electrodes of gates 182 and 184, respectively. The sidewall spacers 214 overlie and thereby mask off and protect the portions of the shallow n+ well regions 206 and 208 that are adjacent to the gate electrodes and channels. Thus, the p+ well regions 210 and 212 extend under a substantial portion of the n+ wells 206 and 208 and are disposed in close proximity to the channels. The resistance of the p– tubs 204 and 206 underneath the effective n+ well areas (i.e., the portion of n+ wells 206 and 208 under sidewall spacers 214) is very small due to the deep and narrow p– tubs 202 and 206. Therefore, high-voltage diode 140 has a very low cathode to anode leakage even at high levels of reverse bias.

Silicide layer 216 is formed over and electrically interconnects (i.e., shorts together) n+ well 206 and p+ well 210. Similarly, silicide layer 218 is formed over and electrically interconnects n+ well 208 and p+ well 212.

N– well 220 and p– buffer 222 are formed in second epitaxial layer 176 and in self-alignment with an inner edge of the electrodes for gates 182 and 184, respectively. More particularly, n– well 220 is formed within p– buffer 222. N– well 220 and p– buffer 222 are compatible with the layers and architecture used in fabricating isolated driver devices, such as isolated LDMOS drivers, formed in PIC 138 built on substrate 142. N– well 220 is doped with n-type dopants, such as, for example, phosphorous, to a dopant concentration of approximately $5E16$ to $5E18$ atoms/cm$^3$ and has a depth of from approximately 0.1 to approximately 0.4 micrometers. P– buffer 222 is doped with p-type dopants, such as, for example, boron, to a dopant concentration of approximately $4E15$ to $4E17$ atoms/cm$^3$ and has a depth of from approximately 0.2 to approximately 0.8 micrometers. A second n+ well 226 is formed within the central portions of n– well 220 and p-buffer 222. N+ well 226 has a dopant concentration of approximately $1E19$ to $1E21$ atoms/cm$^3$ and a depth of from approximately 0.1 to approximately 0.3 micrometers. A layer of silicide 230 is formed over and electrically interconnected with n+ well 226.

Anode 240 of diode 140 is formed by electrically connecting together n+ wells 162 and 164 with silicide layers 166 and 168, and thereby to the electrodes of gates 182 and 184, respectively, and with silicide layers 192 and 194, and thereby to p+ wells 210 and 212 and n+ wells 206 and 208. Cathode 250 of diode 140 is formed by an electrical connection to silicide layer 230, which as described above, is electrically interconnected with n+ well 226.

Figure 6:
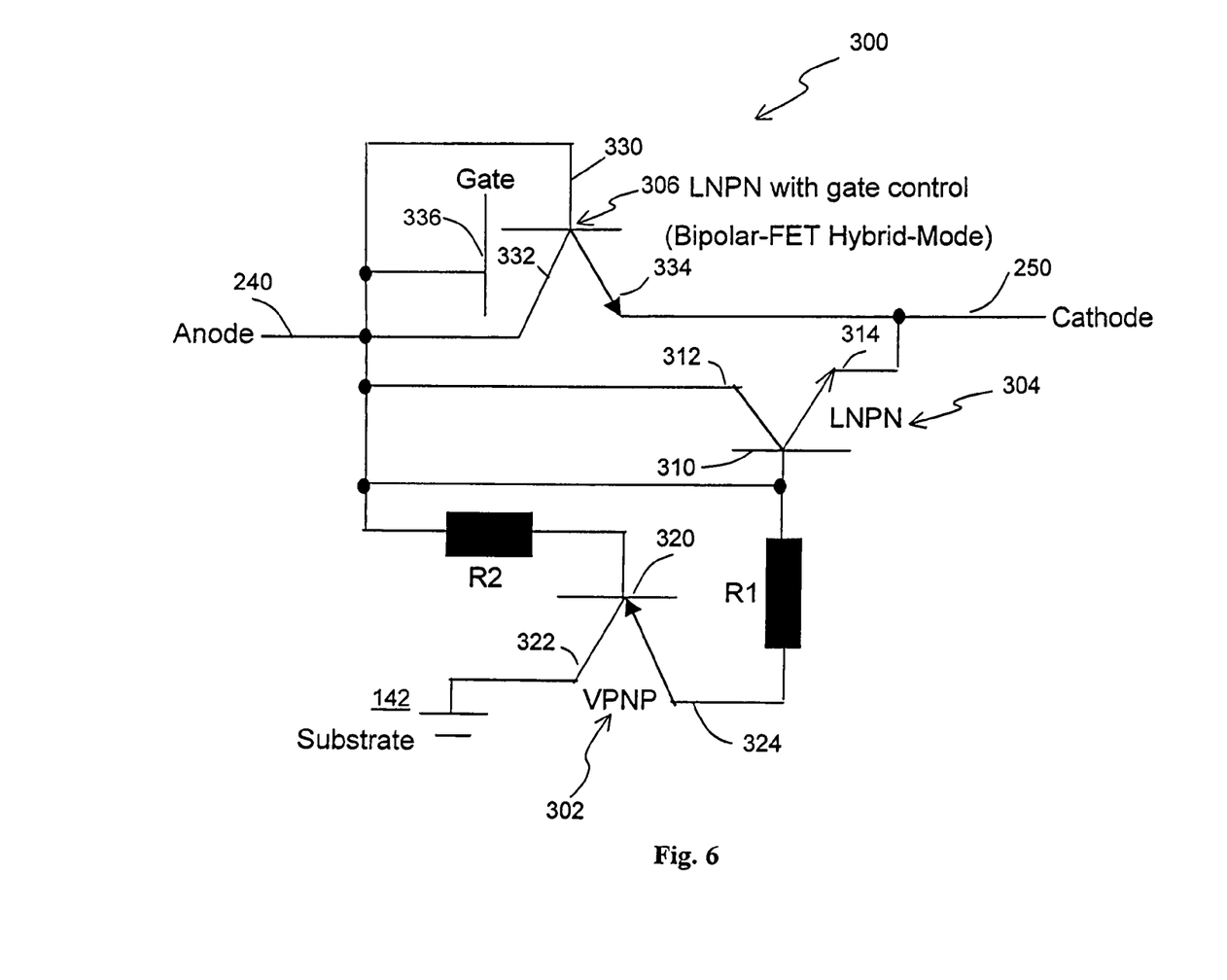
FIG. 6 is an equivalent circuit for the diode of FIG. 5.

Referring now to FIG. 6, an equivalent circuit for diode 140 is illustrated. Equivalent circuit 300 includes a vertical parasitic transistor 302, a lateral transistor 304 and a gate-controlled lateral transistor 306. More particularly, p– tub well 202 forms the base 310, anode 240 forms the collector 312, and cathode 250 forms the emitter 324 of lateral transistor 304. Isolation region 150 forms the base 320, substrate 142 forms the collector 322, and p-tub well 202 forms the emitter 324 of vertical parasitic transistor 302. Anode 240 forms the base 330 and collector 332, and cathode 250 forms the emitter 334, of gate-controlled lateral transistor 306. Gate-controlled lateral transistor 306 further includes gate 336 also formed by anode 240.

A first resistor R1 is interconnected between the base 330 of gate-controlled transistor 306 and the emitter 324 of vertical parasitic transistor 302, and represents the resistance of the second epitaxial layer 176 between p– tub well 202 and p-diff layer 172. A second resistor R2 is interconnected between the base 320 of transistor 302 and anode 240 to which the gate 336, base 330 and collector 332 of gate-controlled lateral transistor 306 and the base 310 of lateral transistor 304 are electrically connected, as described above.

In use, high-voltage diode 140 also operates in a bipolar-FET hybrid mode. More particularly, high-voltage diode 140 operates in the bipolar mode when anode current commences to flow due to a positive bias voltage applied to anode 240 (FIGS. 5 and 6) relative to cathode 250 and a voltage applied to gate 336 that is at least equivalent to the voltage drop of a forward-biased p-n junction, such as, for example, approximately 0.7 Volts. Thus, gate-controlled lateral transistor 306 operates in the bipolar mode and has a high current gain due to the short channel length of the device. The channel length is determined at least in part by the length of the polysilicon electrodes of gates 182, 184, which is easily less than or equal to approximately 0.5 micron using current deep sub-micron fabrication processes.

Gate-controlled lateral transistor 306 also operates in the FET mode of operation. The p– tub wells 202 and 204 are tied to control gates 182 and 184, and as the voltage applied to anode 240 increases the junctions between p-tub wells 202, 204 and epitaxial layer 176 to n-type drift well 220 become forward biased thereby causing the gate threshold voltage to drop. Thus, the FET mode of operation of gate-controlled lateral transistor 306 acts, in conjunction with its bipolar mode, to provide enhanced drive capability. Further, the short channel length and high current gain in gate-controlled lateral transistor 306 draws or provides a path for current that would otherwise flow through parasitic vertical PNP transistor 302, and thereby reduces the parasitic substrate leakage current.

Lateral NPN 304 also acts to reduce the parasitic substrate leakage current. After the junction formed by the interface of p– tubs 202, 204 and second epitaxial layer 176 with n-type drift well 220 becomes forward biased and begins to conduct, the lateral NPN 304 starts working due to NISO rings 154, 156 to epitaxial layer 176 junction being reverse biased and epitaxial layer 176 to n-type drift well 220 being forward biased. The lateral NPN 304 helps gate control lateral NPN 306 to further compete with the parasitic vertical PNP 302 to reduce parasitic substrate leakage. It is noted that NISO rings 154, 156 are tied to together and to anode 240. As the anode to the cathode of diode 140 becomes forward biased, the voltage/potential of NISO 150 relative to cathode 250 is increased.

When the resistance of R1 (FIG. 6) is much greater than that of R2, the emitter-to-base and collector-to-base junctions of vertical PNP transistor 302, i.e., emitter 324 to base 320 junction and collector 322 to base 320 junction, are reversed biased, and the vertical PNP does not conduct. Therefore, diode 140 has a substantially reduced and very low substrate leakage current even at relatively high values of applied forward bias voltage, and further has a low forward-biased voltage drop.

Under reverse bias conditions, diode 140 has an increased reverse breakdown voltage relative to a conventional diode-connected lateral PNP transistor. For example, a conventional diode-connected lateral PNP transistor with a drift region of approximately 1.3 microns in length typically supports approximately 40 Volts in reverse voltage with a forward voltage drop of approximately 1.1V at a current density of 100 microamperes per square micron ($\mu A/\mu m^2$) of anode area. In the high-voltage diode of the present invention, however, the surface field is reduced by two-dimensional depletion enhanced RESURF in the high voltage reversed-bias diode drift area 220. The enhanced RESURF effect has an optimum at a n– drift well 220 dopant concentration or dose Q/q of approximately 3.5E12 to approximately 4.5E12 atoms/cm$^2$, which is compatible with drivers, such as isolated LDMOS drivers, to be formed on the same substrate. The very low reverse biased cathode-to-anode leakage current is achieved by hetero-doped wells 206, 202 and 208, 204, as discussed above.

It should be particularly noted that substrate 42 as defined herein encompasses a monocrystaline silicon substrate of a first conductivity type, such as, for example, a p– type silicon substrate or a p– epitaxial layer formed over a p+ type silicon substrate.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed is:

1. A high voltage diode formed integrally with a power integrated circuit on a substrate of a first conductivity type, comprising:

an isolation layer of a second conductivity type opposite said first conductivity type formed in said substrate;

an epitaxial layer of said first conductivity type formed on said substrate;

an HV well of said second conductivity type formed within said epitaxial layer;

an anode including a pair of spaced apart gates formed over said HV well, said gates having gate electrodes with sidewall spacers, lightly-doped tub wells of said first conductivity type formed in said HV well between said gates and extending partially under a corresponding one of said gate electrodes, a pair of spaced apart heavily-doped wells of said second conductivity type formed in said HV well, each said heavily-doped well of said second conductivity type formed in self alignment with an inner edge of a corresponding one of said gate electrodes, a heavily-doped well of said first conductivity type formed between said gates and in self alignment with said sidewall spacers, said pair of heavily-doped wells of said second conductivity type and said heavily-doped well of said first conductivity type being electrically interconnected to each other and to said insulated gates; and a cathode including a pair of heavily-doped first wells of said second polarity type formed in said HV well, each said first well being spaced apart from an outer edge of a corresponding one of said gates, a second heavily-doped well of said first polarity type formed adjacent to each said first well on a side thereof furthest from the corresponding gate, and a third heavily-doped well of said second polarity type formed adjacent to each said first well on a side thereof nearest the corresponding gate, said first, second and third wells being electrically interconnected with each other.

2. The device of claim 1, wherein said anode further comprises a first layer of silicide formed over and electrically interconnecting said pair of heavily-doped wells of said second conductivity type and said heavily-doped well of said first conductivity type formed between said pair of spaced apart wells.

3. The device of claim 1, wherein said anode further comprises a second layer of silicide formed over at least a portion of said electrodes, said first and second layers of silicide being electrically interconnected with each other.

4. The device of claim 1, wherein said cathode further comprises respective layers of silicide disposed over and electrically interconnecting each pair of first wells with corresponding second and third wells.

5. The device of claim 1, wherein said lightly-doped tub wells of said anode have a dopant concentration of from approximately 5E16 to approximately 5E18 atoms/cm$^3$ and a depth of from approximately 0.2 to approximately 0.9 micrometers.

6. The device of claim 5, wherein said heavily-doped wells of said second conductivity type of said anode have a dopant concentration of from approximately 5E18 to approximately 1E21 atoms/cm$^3$ and a depth of from approximately 0.03 to approximately 0.25 micrometers.

7. The device of claim 6, wherein said heavily-doped well of said first conductivity type of said anode has a dopant concentration of from approximately 1E19 to approximately 1E21 atoms/cm$^3$ and a depth of from approximately 0.12 to approximately 0.5 micrometers.

8. The device of claim 1, wherein said heavily-doped first and third wells of said cathode have dopant concentrations of from approximately 5E18 to approximately 1E21 atoms/cm$^3$ and a depth of from approximately 0.15 to approximately 0.8 micrometers.

9. The device of claim 8, wherein said heavily-doped second wells of said cathode have dopant concentrations of from approximately 1E19 to approximately 1E21 atoms/cm$^3$ and a depth of from approximately 0.12 to approximately 0.5 micrometers.

10. A high voltage diode formed integrally with a power integrated circuit on a substrate of a first conductivity type, comprising:

an isolation layer of a second conductivity type opposite said first conductivity type formed in said substrate;

an epitaxial layer of said first conductivity type formed over said diffusion layer;

a pair of spaced apart isolation rings each extending from said isolation layer to an exposed surface of said epitaxial layer;

spaced apart gates formed on said exposed surface between said isolation rings, each of said gates including an insulating layer, an electrode disposed over said insulating layer, and sidewall spacers;

pairs of hetero-doped wells formed in said epitaxial layer of said first conductivity type and in self-alignment with a respective outer edge of each said gate electrode, each said pair of hetero-doped wells including a relatively deep and lightly-doped tub well of said first conductivity type and a relatively shallow and heavily-doped well of said second conductivity type, each said tub well being electrically interconnected with a corresponding heavily-doped well, and said pairs of hetero-doped wells being electrically interconnected with each other and said electrodes;

second wells of said first polarity type formed in said epitaxial layer of said first conductivity type, each said second well being disposed adjacent to a respective one of said gates on a side thereof nearest said isolation rings and at least partially within a corresponding tub well, said second wells formed in self-alignment with said sidewall spacers;

a second well of said second polarity type formed in each said isolation ring and being electrically interconnected with said hetero-doped wells and said electrodes;

a lightly-doped buffer well of the first polarity type between said electrodes and extending a predetermined distance there under;

a lightly-doped third well of said second polarity type formed within said buffer well and in self-alignment with said electrodes; and a heavily-doped fourth well of said second polarity type formed within said third well and said buffer well.

11. The device of claim 10, wherein each said tub well of said hetero-doped wells has a dopant concentration of from approximately 5E16 to approximately 1E18 atoms/cm$^3$ and a depth of from approximately 0.2 to approximately 0.9 micrometers.

12. The device of claim 11, wherein each said heavily-doped well of said second conductivity type of said hetero-doped wells has a dopant concentration of from approximately 1E19 to approximately 1E21 atoms/cm$^3$ and a depth of from approximately 0.03 to approximately 0.12 micrometers.

13. The device of claim 10, wherein second wells of said first polarity type have dopant concentrations of from approximately 1E19 to approximately 1E21 atoms/cm$^3$ and depths of from approximately 0.1 to approximately 0.3 micrometers.

14. The device of claim 10, wherein said lightly-doped buffer well of the first polarity type has a dopant concentration of from approximately 4E15 to approximately 4E17 atoms/cm$^3$ and a depth of from approximately 0.2 to approximately 0.8 micrometers.

15. The device of claim 10, wherein said lightly-doped third well of said second polarity type formed within said buffer well has a dopant concentration of from approximately 5E16 to approximately 5E18 atoms/cm$^3$ and a depth of from approximately 0.1 to approximately 0.4 micrometers.

16. The device of claim 10, wherein said heavily-doped fourth well of said second polarity type formed within said third well and said buffer well has a dopant concentration of from approximately 1E19 to approximately 1E21 atoms/cm$^3$ and a depth of from approximately 0.1 to approximately 0.3 micrometers.

17. A high voltage diode formed integrally with a power integrated circuit on a substrate of a first conductivity type, comprising:

an isolation layer of said second conductivity type formed in said substrate;

an epitaxial layer of said first conductivity type formed upon said substrate;

an HV well of said second conductivity type formed within said epitaxial layer;

an anode including a pair of spaced apart gates over said HV well, lightly-doped tub wells of said first conductivity type in said HV well between said gates and extending a predetermined distance thereunder, a heavily-doped well of said second conductivity type in each tub well and self aligned with said gates, a heavily-doped well of said first conductivity type formed between said gates substantially overlapping and electrically interconnected with said pair of heavily-doped wells of said second conductivity type; and a cathode structure.

18. The device of claim 17, wherein said cathode structure comprises:
  a pair of heavily-doped first wells of said second polarity type formed in said HV well, each said first well being spaced apart from an outer edge of a corresponding one of said gates;
  a second heavily-doped well of said first polarity type formed adjacent to each said first well on a side thereof furthest from the corresponding gate; and
  a third heavily-doped well of said second polarity type formed adjacent to each said first well on a side thereof nearest the corresponding gate, said first, second and third wells being electrically interconnected with each other.

19. A diode-connected lateral transistor on a substrate of a first conductivity type, said diode-connected lateral transistor having a vertical parasitic transistor including a base, emitter and collector, said base comprising a cathode of said diode-connected lateral transistor, said emitter comprising an anode of said diode-connected lateral transistor, and said collector comprising the substrate of said diode-connected lateral transistor, a parasitic substrate leakage current flowing through said vertical parasitic transistor, said diode-connected lateral transistor comprising:
  means for shunting the flow of parasitic substrate leakage current away from said vertical parasitic transistor.

20. The device of claim 19, wherein said means for shunting shunts the parasitic substrate leakage current to said cathode.

21. The device of claim 19, wherein said means for shunting comprises a gate-controlled lateral transistor having a base, emitter and collector, said base comprising the anode, the emitter comprising the cathode, the collector comprising the anode, and the gate comprising the anode.

22. A diode-connected lateral transistor on a substrate of a first conductivity type, said diode-connected lateral transistor having a vertical parasitic transistor including a base, emitter and collector, said base comprising an anode of said diode-connected lateral transistor, said emitter comprising an anode of said diode-connected lateral transistor, and said collector comprising the substrate of said diode-connected lateral transistor, a parasitic substrate leakage current flowing through said vertical parasitic transistor, said diode-connected lateral transistor comprising:
  means for shunting at least a portion of the flow of parasitic substrate leakage current away from said vertical parasitic transistor.

23. The device of claim 22, wherein said means for shunting shunts the parasitic substrate leakage current to said cathode.

24. The device of claim 22, wherein said means for shunting comprises a gate-controlled lateral transistor having a base, emitter and collector, said base comprising the anode, the emitter comprising the cathode, the collector comprising the anode, and the gate comprising the anode.

25. A method of reducing parasitic substrate leakage current in a diode-connected lateral transistor, the diode-connected lateral transistor including a parasitic vertical transistor through which said parasitic substrate leakage current flows, said method comprising:
  shunting at least a portion of the parasitic leakage current away from the parasitic vertical transistor.

26. The method of claim 25, wherein said shunting step comprises providing a gate-controlled lateral transistor having a base, emitter and collector, said base comprising the anode, the emitter comprising the cathode, the collector comprising the anode, and the gate comprising the anode of the diode-connected transistor, said gate-controlled lateral transistor configured for being forward biased by the same polarity of voltage required to forward bias the diode-connected lateral transistor.

* * * * *